(12) United States Patent
Sumino et al.

(10) Patent No.: US 6,335,143 B1
(45) Date of Patent: Jan. 1, 2002

(54) RESIST COMPOSITION CONTAINING SPECIFIC CROSS-LINKING AGENT

(75) Inventors: Motoshige Sumino; Hirotoshi Fujie, both of Kawagoe; Akiko Katsuyama; Masayuki Endo, both of Takatsuki, all of (JP)

(73) Assignees: Wako Pure Chemical Industries Ltd.; Matsushita Electronics Corporation, both of Osaka (JP)

( * ) Notice: Subject to any disclaimer, the term of this patent is extended or adjusted under 35 U.S.C. 154(b) by 0 days.

(21) Appl. No.: 09/100,973

(22) Filed: Jun. 22, 1998

(30) Foreign Application Priority Data

Jun. 25, 1997 (JP) ............................................. 9-184365

(51) Int. Cl.$^7$ ........................ G03F 7/004; C07D 303/00
(52) U.S. Cl. ................. 430/280.1; 430/325; 430/270.1; 549/512
(58) Field of Search .............................. 430/927, 270.1, 430/325, 280.1; 549/512, 547

(56) References Cited

U.S. PATENT DOCUMENTS

| | | | | |
|---|---|---|---|---|
| 2,750,395 A | * | 6/1956 | Phillips et al. ............... | 260/348 |
| 3,264,230 A | | 8/1966 | Proops .......................... | 260/2 |
| 3,281,376 A | * | 10/1966 | Proops .......................... | 260/2 |
| 4,291,114 A | | 9/1981 | Berggren et al. ............ | 430/253 |
| 4,629,677 A | * | 12/1986 | Katoh .......................... | 430/215 |
| 4,657,842 A | * | 4/1987 | Finter et al. ................. | 430/280 |
| 4,694,029 A | | 9/1987 | Land ............................. | 522/8 |
| 4,845,162 A | * | 7/1989 | Schmitt et al. .............. | 525/423 |
| 5,079,129 A | * | 1/1992 | Roth et al. ................... | 430/280 |
| 5,599,651 A | * | 2/1997 | Steinmann et al. ...... | 430/280.1 |
| 5,837,419 A | * | 11/1998 | Ushirogouchi et al. .. | 430/270.1 |

FOREIGN PATENT DOCUMENTS

| | | | | |
|---|---|---|---|---|
| EP | 0 262 414 | | 4/1988 | |
| EP | 386 529 | * | 9/1990 | ............ G03C/1/89 |
| EP | 425 418 | * | 5/1991 | ........... G03F/7/038 |
| EP | 479166 | * | 4/1992 | ......... C07D/301/00 |
| EP | 0 509 512 A1 | | 10/1992 | |
| EP | 0 605 361 A2 | | 7/1994 | |
| GB | 832565 | | 4/1960 | |

* cited by examiner

*Primary Examiner*—Rosemary Ashton
(74) *Attorney, Agent, or Firm*—Armstrong, Westerman, Hattori, McLeland & Naughton, LLP

(57) ABSTRACT

A resist composition comprising an alkali-soluble polymer, a special cross-linking agent containing one or more oxirane rings and at least one of —O—, —CO—,—COO— and —OCO— groups in the molecule, a photoacid generator, and a solvent can form a film having high transmittance for deep UV light such as ArF excimer laser beams and high etching resistance as well as high resolution, and thus suitable for forming a negative working pattern.

20 Claims, No Drawings

RESIST COMPOSITION CONTAINING SPECIFIC CROSS-LINKING AGENT

BACKGROUND OF THE INVENTION

This invention relates to a resist composition containing a specific cross-linking agent useful in the production of semiconductor devices, etc., a process for forming a pattern using the resist composition, and a cross-linking agent for a negative working resist material using ArF excimer laser beams.

Recently, with an increase of integration of semiconductor integrated circuits, the minimum pattern in the integrated circuits becomes submicron order and this tendency is further advancing to more minimized one. It is a photolithography technique that plays an important role in the formation of fine patterns in the production of semiconductor devices.

Generally speaking, a resolution degree R of a resist in a reduced projective method is shown by the equation of Rayleigh: R=k·λ/NA (wherein λ is a wavelength of light from an exposure source, NA is a numerical aperture of a lens, and k is a process constant). As is clear from this equation, it is understood that in advance of minimization, the resolution degree of a resist can be increased proportionally, when a more shortened wavelength of light from the exposure source is used. By applying this, at present, an ultra LSI has been produced by an exposure technique using i-line light (wavelength of 365 nm) and KrF excimer laser beams (wavelength of 248 nm) as an exposure source, and further an exposure technique using ArF excimer laser beams (wavelength of 193 nm) as an exposure source has been developed in order to comply with still further minimized processing.

In order to form a pattern of submicron order with the use of an exposure light having more shortened wavelength such as deep UV light and one belonging to an area of vacuum UV, a resist used is required to have excellent transmittance against the wavelength of the exposure light and further to have excellent dry etching resistance. However, so far known resist materials have such a defect in that they show high absorbance against ArF excimer laser beams and hardly transmit the laser beams because they contain an aromatic ring such as phenol in its molecule, resulting in failing to form a fine pattern.

Under such a situation, resist materials containing no aromatic ring, having high transmittance against ArF excimer laser beams and high dry etching resistance have been developed. For instance, it is reported in JP-A 9-73173 and JP-A 8-259626 that resist materials wherein methacrylic acid is used as a base resin and an alicyclic ring is introduced show high transmittance and high dry etching resistance and thus can form a fine pattern of 0.2 μm or less. However, all of these resist materials as mentioned above belong to positive type resist in which the part (or area) exposed to a light is dissolved in a developing solution.

On the other hand, a Levenson type phase shift method using a phase of light has been developed in i-line light lithography and KrF excimer laser lithography as an ultra resolution technique in compliance with minimization beyond the resolution limit of light. This technique is considered to be applied also to ArF excimer laser lithography. However, the Levenson type phase shift technique requires a negative type resist process because of a structure of a mask and cannot be applied to so far developed positive type resists.

Additionally, so far known negative type resists generally comprise as a matrix polymer a resin containing a benzene ring such as novolac resin and polyvinyl phenol and a triazine type compound as a cross-linking agent. Further, a resist using an epoxy group has been proposed as disclosed in Willard Conley, et al, Proc. SPIE, vol. 1262, 49 (1990). However, since a phenol resin is used as a matrix polymer, there is such a defect in that ArF excimer laser beams cannot be used because of its high absorbability to ArF excimer laser beams.

As mentioned above, a combination of the ArF excimer laser beams exposure technique with the Levenson type phase shift method seems to be very effective for the minimization, but there has been a problem in that no negative type resist applicable thereto has been developed yet and thus no negative type pattern can be formed.

SUMMARY OF THE INVENTION

Under such circumstances as mentioned above, the present invention has been accomplished to overcome the defects of prior art.

An object of the present invention is to provide a novel resist composition capable of giving a resist film which shows high transmittance of deep UV light having such a short wavelength as 220 nm or less and excellent etching resistance and thus can be applied to ArF excimer laser lithography using the Levenson type phase shift method, to provide a process for forming a pattern using this resist composition and to provide a novel cross-linking agent for an ArF negative type resist material.

The present invention provides a resist composition comprising (a) an aliphatic alkali-soluble polymer, (b) a compound represented by the following formula [1], [2] or [3], (c) a photo-sensitive compound which generates an acid upon exposure to light, and (d) a solvent capable of dissolving the above components (a) to (c);

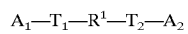

[1]

wherein $R^1$ is a divalent aliphatic hydrocarbon residue which may contain at least one of —O—, —CO—, —COO— and —OCO—; $A_1$ and $A_2$ are independently an alkyl group containing one or more oxirane rings; and $T_1$ and $T_2$ are independently, —O—, —COO— or —OCO—,

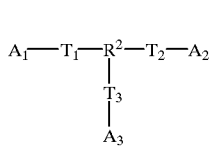

[2]

wherein $R^2$ is a trivalent aliphatic hydrocarbon residue which may contain at least one of —O—, —CO—, —COO— and —OCO—; $A_1$ to $A_3$ are independently an alkyl group containing one or more oxirane rings; and $T_1$ to $T_3$ are independently, —O—, —COO— or —OCO—,

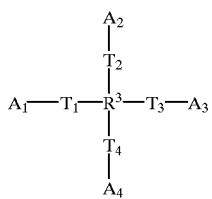

wherein $R^3$ is a tetravalent hydrocarbon residue which may contain at least one of —O—, —CO—, —COO— and —OCO—; $A_1$ to $A_4$ are independently an alkyl group containing one or more oxirane rings; and $T_1$ to $T_4$ are independently, —O—, —COO— or —OCO—.

The present invention also provides a process for forming a pattern, which comprises a step of applying a resist composition described above to a substrate, a step of subjecting the resulting substrate to heat treatment and then exposure to light having a wavelength of 220 nm or less through a mask, and a step of developing the thus treated substrate using a developing solution, if necessary, after baking treatment.

The present invention further provides a cross-linking agent for an ArF negative working resist material, comprising a compound represented by the following formula [1], [2] or [3]:

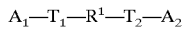  [1]

wherein $R^1$, $A_1$, $A_2$, $T_1$ and $T_2$ are as defined above,

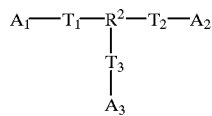  [2]

wherein $R^2$, $A_1$, $A_2$, $A_3$, $T_1$, $T_2$ and $T_3$ are as defined above,

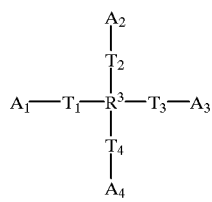  [3]

wherein $R^3$, $A_1$, $A_2$, $A_3$, $A_4$, $T_1$, $T_2$, $T_3$ and $T_4$ are as defined above.

The present invention still further provides a compound represented by the formula:

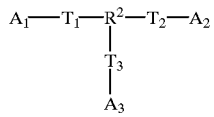  [2]

wherein $R^2$, $A_1$, $A_2$, $A_3$, $T_1$, $T_2$ and $T_3$ are as defined above, except for a case wherein $R^2$ is

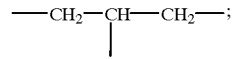

each of $T_1$ to $T_3$ is —O—; and each of $A_1$ to $A_3$ is a glycidyl group.

DESCRIPTION OF THE PREFERRED EMBODIMENTS

The present inventors have made extensive study for realizing the above-mentioned objects to find that when the compound of the formula [1], [2] or [3] is used as a cross-linking agent, a resist composition showing high photo-transparency in a wavelength range of 220 nm or less and capable of forming a fine negative type pattern can be obtained, and have accomplished the present invention on the basis of this finding.

The resist composition of the present invention comprises
(a) an aliphatic alkali-soluble polymer,
(b) a compound represented by the formula:

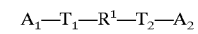  [1]

wherein $R^1$ is a divalent aliphatic hydrocarbon residue which may contain at least one of —O—, —CO—, —COO— and —OCO—; $A_1$ and $A_2$ are independently an alkyl group containing one or more oxirane rings; and $T_1$ and $T_2$ are independently, —O—, —COO— or —OCO—,

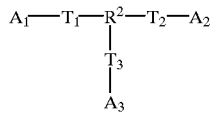  [2]

wherein $R^2$ is a trivalent aliphatic hydrocarbon residue which may contain at least one of —O—, —CO—, —COO— and —OCO—; $A_1$ to $A_3$ are independently an alkyl group containing one or more oxirane rings; and $T_1$ to $T_3$ are independently, —O—, —COO— or —OCO—, or

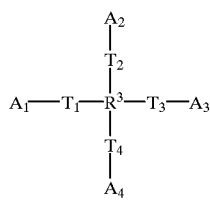  [3]

wherein $R^3$ is a tetravalent hydrocarbon residue which may contain at least one of —O—, —CO—, —COO— and —OCO—; $A_1$ to $A_4$ are independently an alkyl group containing one or more oxirane rings; and $T_1$ to $T_4$ are independently, —O—, —COO— or —OCO—, (c) a photosensitive compound which generates an acid upon exposure to light, and (d) a solvent capable of dissolving the above components (a) to (c).

The aliphatic alkali-soluble polymer in this invention means alkali-soluble polymers containing substantially no aromatic group in the polymer chain.

In the formula [1], $R^1$ is a divalent aliphatic hydrocarbon residue which may contain at least one of —O—, —CO—, —COO— and —OCO—, said divalent aliphatic hydrocarbon residue including any of straight chained, branched and cyclic ones.

The straight chained and branched divalent aliphatic hydrocarbon residue includes one having 1 to 6 carbon atoms. Examples of such groups are a methylene group, an ethylidene group, a 1,2-ethane-di-yl group, a propylidene group, a 1,2-propane-di-yl group, a 1,3-propane-di-yl group, an isopropylidene group, a butylidene group, a 1,2-butane-di-yl group, a 1,3-butane-di-yl group, a 1,4-butane-di-yl group, a 2-methyl-1,2-propane-di-yl group, a 2-methyl-1,3-propane-di-yl group, a pentylidene group, a 1,2-pentane-di-yl group, a 1,4-pentane-di-yl group, a 1,5-pentane-di-yl group, a 2,3-pentane-di-yl group, a 2,4-pentane-di-yl group, a 2-methyl-2-butane-di-yl group, a 2-methyl-, 3-butane-di-yl group, a 2-methyl-1,4-butane-di-yl group, a 2-methyl-1,5-butane- di-yl group, a 2- methyl-2,3-butane-di-yl group, a 2-methyl-2,4-butane-di-yl group, a 2,2-dimethyl-1,3-propane-di-yl group, a heyxlidene group, a 1,2-hexane-di-yl group, a 1,3-hexane-di-yl group, a 1,4-hexane-di-yl group, a 1,5-hexane-di-yl group, a 1,6-hexane-di-yl group, a 2,3-hexane-di-yl group, a 2,4-hexane-di-yl group, a 3,4-hexane-di-yl group, etc. Among them, those having 1 to 4 carbon atoms are preferable.

The cyclic divalent aliphatic hydrocarbon residue includes one having 3 to 7 carbon atoms. Examples of such groups are a 1,2-cyclopropane-di-yl group, a 1,2-cyclobutane-di-yl group, a 1,3-cyclobutane-di-yl group, a 1,2-cyclopentane-di-yl group, a 1,3-cyclopentane-di-yl group, a 1,2-cyclohexane-di-yl group, a 1,3-cyclohexane-di-yl group, a 1,4-cyclohexane-di-yl group, a 1,2-cycloheptane-di-yl group, a 1,3-cycloheptane-di-yl group, a 1,4-cycloheptane-di-yl group, etc. Among them, those having 5 to 7 carbon atoms are preferable.

Specific examples of the divalent aliphatic hydrocarbon residue containing at least one of —O—, —CO—, —COO— and —OCO—are those containing 1 to 5, preferably 1 to 3 —CO—, —COO— and/or —OCO— groups therein. Examples of such groups are shown by the following formulae [4] to [10]:

—Q$_1$—O—Q$_1$— [4]

—Q$_1$—O—Q$_1$—O—Q$_1$— [5]

—Q$_1$—OCO—Q$_1$— [6]

—Q$_1$—CO—Q$_1$— [7]

—Q$_1$—COO—Q$_1$—O—Q$_1$—OCO—Q$_1$— [8]

—Q$_1$—OCO—Q$_1$—O—Q$_1$—COO—Q$_1$— [9]

—Q$_1$—O—Q$_1$—CO—Q$_1$—O—Q$_1$— [10]

wherein $Q_1$ is a divalent aliphatic hydrocarbon residue.

The divalent aliphatic hydrocarbon residue shown by $Q_1$ in the formulae [4] to [10] has the same meaning as one mentioned above referring to $R^1$ in the formula [1].

The trivalent aliphatic hydrocarbon residue in the trivalent aliphatic hydrocarbon residue which may contain at least one of —O—, —CO—, —COO— and —OCO—, which is shown by $R^2$ in the formula [2], may be any of straight chained, branched and cyclic ones.

The straight chained and branched trivalent aliphatic hydrocarbon residue includes one having 1 to 6 carbon atoms. Examples of such groups are a methine group, an ethylidyne group, a 1-ethanyl-2-ylidene group, a propylidyne group, a 2-propanyl-3-ylidene group, a 1-propanyl-3-ylidene group, a 1-propanyl-2-ylidene group, a 1,2,3-propane-tri-yl group, a butylidyne group, a 3-butanyl-4-ylidene group, a 2-butanyl-4-ylidene group, a 1-butanyl-4-ylidene group, a 1-butanyl-2-ylidene group, a 1,2,3-butan-tri-yl group, a 1,2,4-butane-tri-yl group, a 2-butanyl-3-ylidene group, a 1-butanyl-3-ylidene group, a 2-methylpropylidine group, a 2-methyl-2-propanyl-1-ylidene group, a 2-methyl-1,2,3-propane-tri-yl group, a 2-methyl-1,3,1'-propane-tri-yl group, a pentylidyne group, a 4-pentanyl-5-ylidene group, a 3-pentanyl-5-ylidene group, a 2-pentanyl-5-ylidene group, a 1-pentanyl-5-ylidene group, a 1-pentanyl-2-ylidene group, a 1,2,3-pentane-tri-yl group, a 1,2,4-pentane-tri-yl group, a 1,2,5-pentane-tri-yl group, a 1-pentanyl-3-ylidene group, a 1,3,4-pentane-tri-yl group, a 1,3,5-pentane-tri-yl group, a 3-pentanyl-4-ylidene group, a 2-pentanyl-4-ylidene group, a 1-pentanyl-4-ylidene group, a 2-pentanyl-3-ylidene group, a 2-methylbutylidyne group, a 4-methyl-4-butanyl-5-ylidene group, a 4-methyl-3-butanyl-5-ylidene group, a 4-methyl-2-butanyl-5-ylidene group, a 4-methyl-1-butanyl-5-ylidene group, a 2-methyl-1,2,3-tributane-tri-yl group, a 2-methyl-1,2,4-butane-tri-yl group, a 3-methyl-3-butanyl-4-ylidene group, a 2,2,-dimethylpropylidyne group, a 2,2,-dimethyl-1-propanyl-3-ylidene group, a 2,2-dimethyl-1,3,1'-propane-tri-yl group, a hexylidyne group, a 5-hexanyl-6-ylidene group, a 4-hexanyl-6-ylidene group, a 3-hexanyl-6-ylidene group, a 2-hexanyl-6-ylidene group, a 1-hexanyl-6-ylidene group, a 1,2,3-hexane-tri-yl group, a 1,2,4-hexane-tri-yl group, a 1,2,5-hexane-tri-yl group, a 1,2,6-hexane-tri-yl group, a 1-hexanyl-3-ylidene group, a 1,3,4-hexane-tri-yl group, a 1,3,5-hexane-tri-yl group, a 1,3,6-hexane-tri-yl group, a 4-hexanyl-5-ylidene group, a 3-hexanyl-5-ylidene group, a 2-hexanyl-5-ylidene group, a 1-hexanyl-5-ylidene group, a 2-hexanyl-3-ylidene group, a 2,3,4-hexane-tri-yl group, a 2,3,5-hexane-tri-yl group, a 2,3,6-hexane-tri-yl group, a 3-hexanyl-4-ylidene group, a 2-hexanyl-4-ylidene group, a 1-hexanyl-4-ylidene group, etc. Among them, those having 1 to 4 carbon atoms are preferable.

The cyclic trivalent aliphatic hydrocarbon residue includes one having 3 to 7 carbon atoms. Examples of such groups are a 1,2,3-cyclopropane-tri-yl group, a 1,2,3-cyclobutane-tri-yl group, a 1,2,3-cyclopentane-tri-yl group, a 1,2,4-cyclopentane-tri-yl group, a 1,2,3-cyclohexane-tri-yl group, a 1,2,4-cyclohexane-tri-yl group, a 1,2,5-cyclohexane-tri-yl group, a 1,3,5-cyclohexane-tri-yl group, a 1,2,3-cycloheptane-tri-yl group, a 1,2,4-cycloheptane-tri-yl group, a 1,2,5-cycloheptane-tri-yl group, a 1,3,4-cycloheptane-tri-yl group, a 1,3,5-cycloheptane-tri-yl group, etc. Among them, those having 5 to 7 carbon atoms are preferable.

Specific examples of the trivalent aliphatic hydrocarbon residue containing at least one of —O—, —CO—, —COO— and —OCO— are those containing 1 to 5, preferably 1 to 3 groups selected from —CO—, —COO— and —OCO— groups therein. Examples of the groups are shown by the following formulae [11] to [17].

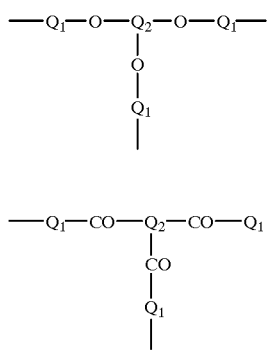

[11]

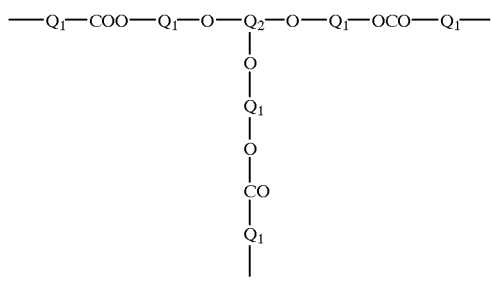

[12]

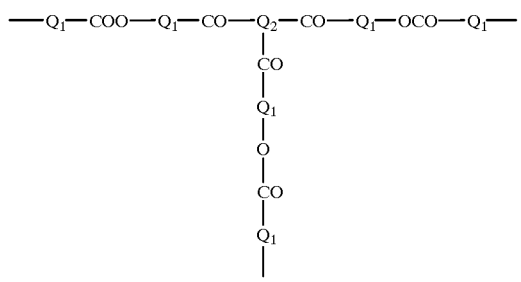

[13]

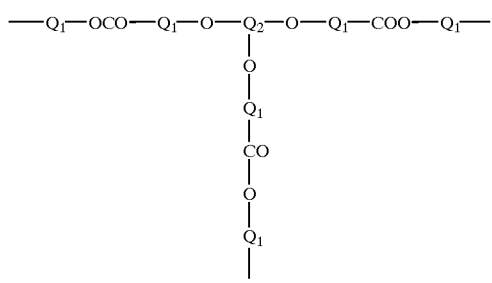

[14]

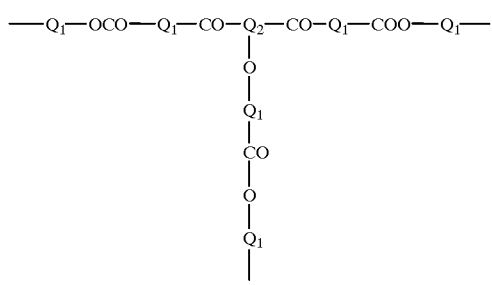

[15]

[16]

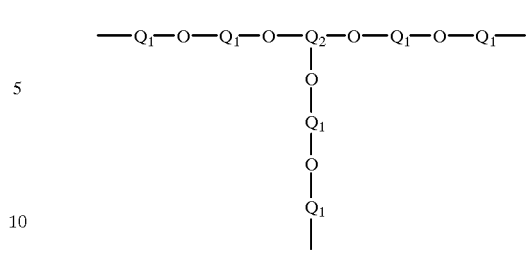

[17]

wherein $Q_2$ is a trivalent aliphatic hydrocarbon residue; and $Q_1$ is as defined above.

The trivalent aliphatic hydrocarbon residue shown by $Q_2$ in the formulae [11] to [17] has the same meaning as one mentioned above referring to $R^2$ in the formula [2].

The tetravalent aliphatic hydrocarbon residue in the tetravalent aliphatic hydrocarbon residue which may contain at least one of —O—, —CO—, —COO— and —OCO—, which is shown by $R^3$ in the formula [3], may be any of straight chained, branched and cyclic ones.

The straight chained and branched tetravalent aliphatic hydrocarbon residue includes one having 1 to 8 carbon atoms. Examples of such groups are a carbon atom, an ethane-di-ylidene group, a 1-ethanyl-2-ylidyne group, a propane-di-ylidene group, a 1-propanyl-3-ylidyne group, a 1,2-propane-di-yl-3-ylidene group, a 1,3-propane-di-yl-2-ylidene group, a butane-di-ylidene group, a 1,2-butane-di-yl-4-ylidene group, a 1,4-butane-di-yl-2-ylidene group, a 1,2,3,4-butane-tetra-yl group, a 2-methyl-1,2,3,1'-propane-tetra-yl group, a pentane-di-ylidene group, a 1,5-pentane-di-yl-2-ylidene group, a 1,5-pentane-di-yl-3-ylidene group, a 1-pentanyl-5-ylidyne group, a 1,2,3,4-pentane-tetra-yl group, a 1,2,3,5-pentane-tetra-yl group, a 2-methyl-1,2,3,4-butane-tetra-yl group, a 2-methyl-1,2,3,1'-butane-tetra-yl group, a 2-methyl-1,2,4,1'-butane-tetra-yl group, a 2,2-dimethyl-1,3,1',1'-propane-tetra-yl group, a hexane-di-ylidene group, a 1,6-hexane-di-yl-2-ylidene group, a 1,6-hexane-di-yl-3-ylidene group, a 1-hexanyl-6-ylidyne group, a 1,2,3,4-hexane-tetra-yl group, a 1,2,3,5-hexane-tetra-yl group, a 1,2,3,6-hexane-tetra-yl group, a 1,2,4,5-hexane-tetra-yl group, etc. Among them, those having 4 to 7 carbon atoms are preferable.

The cyclic tetravalent aliphatic hydrocarbon residue includes one having 3 to 7 carbon atoms. Examples of such groups are a 1,2,3,4-cyclobutan-tetra-yl group, a 1,2,3,4-cyclopentane-tetra-yl group, a 1,2,3,4-cyclohexane-tetra-yl group, a 1,2,3,5-cyclohexane-tetra-yl group, a 1,4-cyclohexane-di-yl-2-ylidene group, a 1,3-cyclohexane-di-yl-5-ylidene group, a 1,2,3,4-cycloheptane-tetra-yl group, a 1,2,4,5-cycloheptane-tetra-yl group, a 1,2,3,5-cycloheptane-tetra-yl group, a 1,2,4,6-cycloheptane-tetra-yl group, a 1,3-cycloheptane-di-yl-5-ylidene group, a 1,2-cycloheptane-di-yl-4-ylidene group, etc. Among them, those having 5 to 7 carbon atoms are preferable.

Specific examples of the tetravalent aliphatic hydrocarbon residue containing at least one of —O—, —CO—, —COO— and —OCO— are those containing 1 to 5, preferably 1 to 3 —CO—, —COO— and/or —OCO— groups therein. Examples of the groups are shown by the following formulae [18] to [23]:

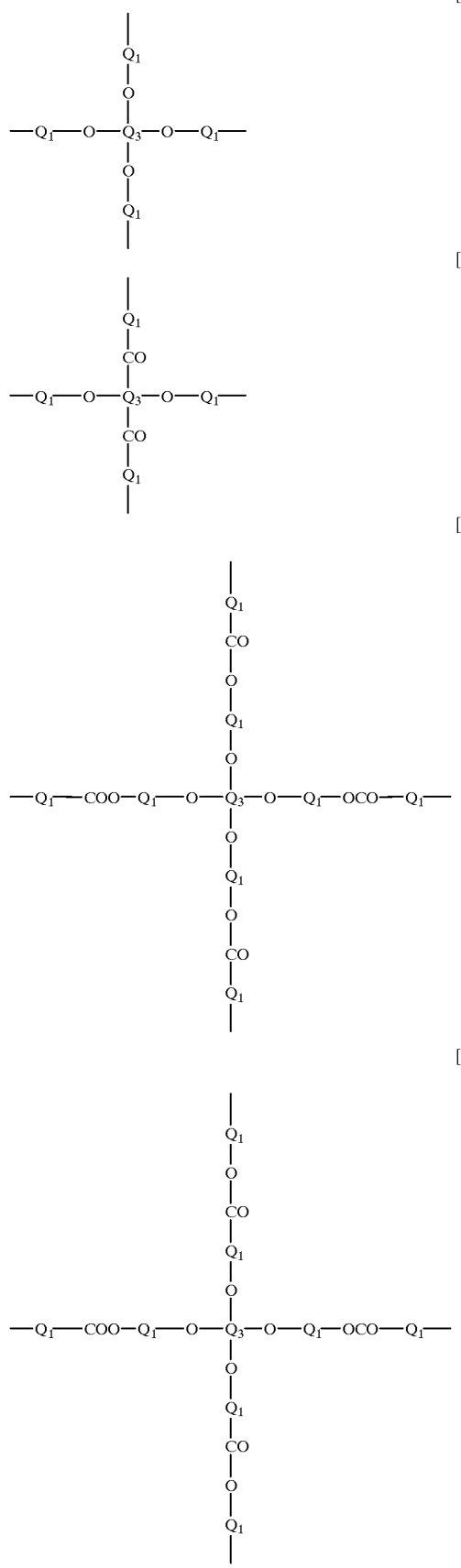

-continued

[22]

[23]

wherein $Q_3$ is a tetravalent aliphatic hydrocarbon residue; and $Q_1$ is as defined above.

The tetravalent aliphatic hydrocarbon residue shown by $Q_3$ in the formulae [18] to [23] has the same meaning as one mentioned above referring to $R^3$ in the formula [3].

The alkyl group containing one or more oxirane rings shown by $A_1$ and $A_2$ in the formulae [1] to [3], shown by $A_3$ in the formulae [2] and [3], and shown by $A_4$ in the formula [4] includes one containing 1 to 3 oxirane rings at terminal position(s) and/or at internal position(s) thereof. These alkyl groups include straight-chained, branched and cyclic. Among these alkyl groups, a cycloalkyl group containing one or more oxirane rings is preferable. Examples of such alkyl groups are those represented by the formula:

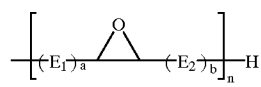

[24]

wherein $E_1$ and $E_2$ are independently a lower alkylene group; a and b are independently 0 or 1; and n is 1 to 3, or by the formula:

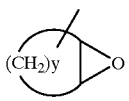

[25]

wherein y is 3 to 5.

The lower alkylene group shown by $E_1$ and $E_2$ in the formula [24] may be straight-chained or branched, including one preferably having 1 to 6 carbon atoms. Examples of these alkylene groups are a methylene group, an ethylene group, a propylene group, a butylene group, a 2-methylpropylene group, a pentylene group, a 2,2-dimethylpropylene group, a 2-ethylpropylene group, a hexylene group, etc.

The specific examples of the alkyl group containing one or more oxirane rings represented by the formula [24] are an epoxy ethyl group, a 2,3-epoxy propyl group (a glycidyl group), a 2,3-epoxy butyl group, a 3,4-epoxy butyl group, a 2,3-epoxy pentyl group, a 3,4-epoxy pentyl group, a 4,5-epoxy pentyl group, a 2,3-, 4,5-diepoxy pentyl group, a 2,3-epoxy hexyl group, a 3,4-epoxy hexyl group, a 4,5-epoxy hexyl group, a 5,6-epoxy hexyl group, a 2,3-, 4,5-diepoxy hexyl group, a 2,3-,5,6-diepoxy hexyl group, a 3,4-, 5,6-diepoxy hexyl group, a 2,3-epoxy heptyl group, a 3,4-epoxy heptyl group, a 4,5-epoxy heptyl group, a 5,6-epoxy heptyl group, a 6,7-epoxy heptyl group, a 2,3-, 4,5-diepoxy heptyl group, a 2,3-, 5,6-diepoxy heptyl group, a 2,3-, 6,7-diepoxy heptyl group, a 3,4-, 5,6-diepoxy heptyl group, a 3,4-, 6,7-diepoxy heptyl group, a 2,3-, 4,5-, 6,7-triepoxy heptyl group, a 1-methyl-2,3-epoxy propyl group, a 2-methyl-2,3-epoxy propyl group, a 1-methyl-2,3-epoxy butyl group, a 3-methyl-3,4-epoxy butyl group, a 1-methyl-2,3-epoxy pentyl group, a 1-methyl-4,5-epoxy pentyl group, a 2-methyl-2,3-epoxy pentyl group, a 2-methyl-4,5-epoxy pentyl group, a 3-methyl-3,4-epoxy pentyl group, a 4-methyl-2,3-epoxy pentyl group, a 4-methyl-3,4-epoxy pentyl group, a 4-methyl-4,5-epoxy pentyl group, a 1-methyl-2,3-epoxy hexyl group, a 2-methyl-3,4-epoxy hexyl group, a 2-methyl-5,6-epoxy hexyl group, a 3-methyl-5,6-epoxy hexyl group, a 4-methyl-2,3-epoxy hexyl group, a 4-methyl- 5,6-epoxy hexyl group, a 1-methyl-2,3-, 4,5-diepoxy pentyl group, a 2-methyl-2,3-, 4,5-diepoxy pentyl group, etc.

The specific examples of the alkyl group containing one or more oxirane rings represented by the formula [25] are a 2,3-epoxy cyclopentyl group, a 3,4-epoxy cyclopentyl group, a 2,3-epoxy cyclohexyl group, a 3,4-epoxy cyclohexyl group, a 2,3-epoxy cycloheptyl group, a 3,4-epoxy cycloheptyl group, a 4,5-epoxy dicycloheptyl group, etc.

The cross-linking agent for ArF negative resist material of the present invention represented by the formulae [1] to [3] can be obtained, for example, by the following preparation methods (a) to (c).

Method (a):

The desired compound can be obtained by reacting a compound of the formula:

    [26]

wherein $R^4$ is a divalent aliphatic hydrocarbon residue, a trivalent aliphatic hydrocarbon residue or a tetravalent aliphatic hydrocarbon residue; and m is 2 to 4, with a compound of the formula:

    [27]

wherein $R^5$ is an alkyl group containing at least one oxirane ring; X is a halogen atom, —COX' (wherein X' is a halogen atom) or a group which is capable of forming a conjugate base of a strong acid by elimination, if necessary in a suitable solvent, and in the presence of a basic catalyst.

In the formula [26], the divalent aliphatic hydrocarbon residue shown by $R^4$ has the same meaning as one mentioned above referring to $R^1$ in the formula [1], the trivalent aliphatic hydrocarbon residue shown by $R^4$ has the same meaning as one mentioned above referring to $R^2$ in the formula [2], and the tetravalent aliphatic hydrocarbon residue shown by $R^4$ has the same meaning as one mentioned above referring to $R^3$ in the formula [3].

The alkyl group containing at least one oxirane ring shown by $R^5$ in the formula [27] has the same meaning as in the formula [24] or [25]. The halogen atom shown by X and X' includes fluorine, chlorine, bromine, iodine, etc. The group which is capable of forming a conjugate base of strong acid by elimination shown by X includes, for example, a p-toluenesulfonyloxy group, a methanesulfonyloxy group, a trifluoromethanesulfonyloxy group, etc.

The basic catalyst includes an organic amine such as triethylamine, diisopropylethylamine, N,N-dimethylaniline, piperidine, pyridine, 4-dimethylamino-pyridine, 1,5-diazobicyclo[4,3,0]non-5-ene, 1,8-diazabicyclo [5,4,0]undec-7-ene, tri-n-butylamine and N-methylmorpholine; and an alkali metal hydroxide such as sodium hydroxide and potassium hydroxide.

The amount of the basic catalyst to be used is not specifically limited and can suitably be selected from the range of 0.1 to 20 moles preferably 1 to 10 moles per mole of the compound of the formula [26].

The solvent which is used upon necessity includes hydrocarbons such as toluene, xylene, benzene, cyclohexane, n-hexane and n-octane; halogenated hydrocarbons such as methylene chloride, dichloroethane and trichloroethylene; esters such as methyl acetate, ethyl acetate, n-butyl acetate and methyl propionate; ethers such as dimethyl ether, diethyl ether, diisopropyl ether, dimethoxyethane, tetrahydrofuran and dioxane; N-methylpyrrolidone, N,N-dimethylformamide, N,N-dimethyl-acetamide, dimethylsulfoxide, water, etc., which may be used alone or in a suitable combination of two or more thereof.

When water or water together with a solvent causing phase separation from water is used as the solvent, the reaction may be conducted, if necessary, with the use of a phase-transfer catalyst such as tetra-n-butylammonium bromide, benzyltriethylammonium chloride, benzyltriethylammonium bromide, benzyltrimethylammonium bromide and methyltrioctylammonium chloride including commercially available ones having Brand Name of Aliquat 336 and Adogen 464 from Aldrich Chemical Co., Inc.

The amount of the phase-transfer catalyst to be used is not specifically limited and generally selected from the range of 0.1 to 50 mole %, preferably 0.1 to 20 mole % based on the amount of the compound of the formula [26].

The amount of the compound of the formula [27] to be used is not specifically limited and can suitably be selected from the range of 1 to 30 moles, preferably 2 to 10 moles per mole of the compound of the formula [26]. The compound of the formula [27] may be used alone or as a mixture thereof.

The reaction temperature is not specifically limited and selected generally from the range of 0 to 150° C., preferably 20 to 80° C.

The reaction time depends upon the kind of the compound of the formula [26] and such reaction conditions as concentration of the compound and is generally selected from the range of 0.5 to 48 hours.

Method (b):

The desired compound can be obtained by reacting a compound of the formula:

$$R^4(X)_p \qquad [28]$$

wherein p is 2 to 4; and $R^4$ and X are as defined above, with a compound of the formula:

$$R^5\text{—OH} \qquad [29]$$

wherein $R^5$ is as defined above, in the presence of a basic catalyst and, if necessary, in a suitable solvent.

The basic catalyst, the solvent which is used upon necessity and the phase-transfer catalyst which is used upon necessity in case of using water or water together with a solvent causing phase separation from water are the same ones as mentioned in the Method (a).

The amount of the basic catalyst to be used is not specifically limited and can suitably be selected from the range of 0.1 to 20 moles, preferably 1 to 10 moles per mole of the compound of the formula [28].

The amount of the phase-transfer catalyst to be used is not specifically limited and can suitably be selected from the range of 0.1 to 50 mole %, preferably 0.1 to 20 mole % based on the amount of the compound of the formula [28].

The amount of the compound of the formula [29] to be used is not specifically limited and can suitably be selected from the range of 1 to 30 moles, preferably 2 to 10 moles per mole of the compound of the formula [28]. The compound of the formula [29] may be used alone or as a mixture thereof.

The reaction temperature is not specifically limited and selected generally from the range of 0 to 150° C., preferably 20 to 80° C.

The reaction time depends upon the kind of the compound of the formula [28] and such reaction conditions as concentration of the compound and is generally selected from the range of 0.5 to 48 hours.

Method (c):

The desired compound can be obtained by subjecting a compound of the formula:

$$B_1\text{—}T_1\text{—}R^1\text{—}T_2\text{—}B_2 \qquad [30]$$

wherein $B_1$ and $B_2$ are independently an aliphatic unsaturated hydrocarbon group containing at least one double bond; and $T_1$, $T_2$ and $R^1$ are as defined above, a compound of the formula:

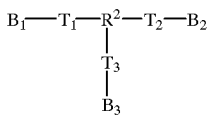

[31]

wherein $B_1$ to $B_3$ are independently an aliphatic unsaturated hydrocarbon group containing at least one double bond; and $T_1$ to $T_3$ and $R^2$ are as defined above, or a compound of the formula:

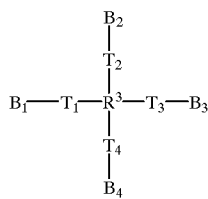

[32]

wherein $B_1$ to $B_4$ are independently an aliphatic unsaturated hydrocarbon group containing at least one double bond; and $T_1$ to $T_4$ and $R^3$ are as defined above, to a reaction in the presence of an oxidizing agent, if necessary, in the presence of a suitable solvent.

The aliphatic unsaturated hydrocarbon group containing at least one double bond shown by $B_1$ to $B_4$ in the above formulas includes one containing 1 to 3 double bonds at a terminal position and/or suitable internal position(s) thereof. The aliphatic unsaturated hydrocarbon group mentioned above includes one having 2 to 14 carbon atoms. Specific examples thereof are an ethenyl group, a propenyl group, a 2-butenyl group, a 3-butenyl group, a 2-pentenyl group, a 3-pentenyl group, a 4-pentenyl group, a 2,4-pentane-di-enyl group, a 2-hexenyl group, a 3-hexenyl group, a 4-hexenyl group, a 5-hexenyl group, a 2,4-hexane-di-enyl group, a 2,5-hexane-di-enyl group, a 3,5-hexane-di-enyl group, a 2-heptenyl group, a 3-heptenyl group, a 4-heptenyl group, a 5-heptenyl group, a 6-heptenyl group, a 2,4-heptane-di-enyl group, a 2,5-heptane-di-enyl group, a 2,6-heptane-di-enyl group, a 3,5-heptane-di-enyl group, a 3,6-heptane-di-enyl group, a 2,4,6-heptane-tri-enyl group, a 1-methyl-2-propenyl group, a 2-methyl-2-propenyl group, a 1-methyl-2-butenyl group, a 3-methyl-3-butenyl group, a 1-methyl-2-pentenyl group, a 1-methyl-4-pentenyl group, a 2-methyl-2-pentenyl group, a 2-methyl-4-pentenyl group, a 3-methyl-3-pentenyl group, a 4-methyl-2-pentenyl group, a 4-methyl-3-pentenyl group, a 4-methyl-4-pentenyl group, a 1-methyl-2-hexenyl group, a 2-methyl-3-hexenyl group, a 2-methyl-5-hexenyl group, a 3-methyl-5-hexenyl group, a 4-methyl-2-hexenyl group, a 4-methyl-5-hexenyl group, a 1-methyl-2,4-pentane-di-enyl group, a 2-methyl-2,4-pentane-di-enyl group, an octenyl group, a dodecanyl group, a 2-cyclopenten-1-yl group, a 3-cyclopenten-1-yl group, a 2-cyclohexen-1-yl group, a 3-cyclohexen-1-yl group, a 2-cyclohepten-1-yl group, a 3-cyclohepten-1-yl group, a 4-cyclohepten-1-yl group, a 2-cycloocten-1-yl group, etc.

The oxidizing agent includes an inorganic peroxide such as hydrogen peroxide and sodium perborate; an organic peroxide such as peracetic acid, perpropionic acid, perbenzoic acid and m-chloroperbenzoic acid, etc.

The amount of the oxidizing agent to be used is not specifically limited and can suitably be selected from the range of 0.1 to 20 moles, preferably 1 to 10 moles per mole of the compound of the formula [30], [31] or [32].

The solvent which is used upon necessity includes hydrocarbons such as toluene, xylene, benzene, cyclohexane, n-hexane and n-octane; halogenated hydrocarbons such as methylene chloride, dichloroethane and trichloroethylene; esters such as methyl acetate, ethyl acetate, n-butyl acetate and methyl propionate; ethers such as dimethyl ether, diethyl ether, diisopropyl ether, dimethoxyethane, tetrahydrofuran and dioxane; N-methylpyrrolidone, N,N-dimethylformamide, N,N-dimethylacetamide, dimethylsulfoxide, water, etc., which may be used alone or in a suitable combination of two or more thereof.

The reaction temperature is not specifically limited and selected generally from the range of 0 to 150° C., preferably 20 to 80° C.

The reaction time depends upon the kind of the compound of the formula [30], [31] or [32] and such reaction conditions as concentration of the compound and is generally selected from the range of 0.5 to 48 hours.

A treatment of the resultant after the reaction can be conducted according to a conventional manner, including purification and/or separation of the compound of the formula [1], [2] or [3] thus obtained by extraction, recrystallization, etc. After such a treatment as above, the resultant can be used as a material for the resist composition.

As the compounds of the formulae [26] to [32] which are used as the starting materials in the above-mentioned methods (a) to (c), commercially available ones may be used, or the compounds may be produced according to a conventional manner.

The cross-linking agent for the ArF negative working resist material of the present invention thus obtained (hereinafter, abbreviated as "the cross-linking agent of the present invention") can provide the following effects. Namely, when it is used as a material in a resist composition together with an aliphatic alkali-soluble polymer, a cross-linking reaction between hydrophilic groups in the aliphatic alkali-soluble polymer on one hand and the cross-linking agent of the formula [1], [2] or [3] on the other hand is allowed to proceed by the act of an acid generated from a photoacid generator, whereby the polymer is made insoluble in an alkaline developing solution. On the other hand, no acid is generated on the part (or area) which is not exposed to light, and thus no cross-linking reaction is allowed to proceed on this non-light-exposed part even by heating, and therefore the polymer remains alkali-soluble. Consequently, there is caused a difference in solubility into an alkaline developing solution between the part exposed to light and the part not exposed to light, so that a well-contrasted negative type pattern is formed.

In this way, the resist composition containing an aliphatic alkali-soluble polymer, the above-mentioned cross-linking agent of the present invention, a photo-sensitive compound which generates an acid upon exposure to light and a solvent capable of dissolving those components can extraordinarily effectively be used as a resist material for ArF excimer laser beams which are expected as new photo-exposure technology belonging to the next generation.

The aliphatic alkali-soluble polymer in the resist composition of the present invention includes one comprising a monomer unit shown by the formula [33] as a structural component:

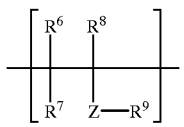

[33]

wherein $R^6$ is a hydrogen atom or a lower alkyl group; $R^7$ is a hydrogen atom, a lower alkyl group, a cyano group, an alkyloxycarbonyl group or a carboxyl group; $R^8$ is a hydrogen atom, a lower alkyl group, an alkyloxycarbonyl group or a carboxyl group; $R^9$ is a hydrophilic group; and Z is a spacer; and $R^7$ and Z—$R^9$ may form together a group of —CO—O—CO— or —CO—NH—CO—.

In the formula [33], the lower alkyl group shown by $R^6$ to $R^8$ may be straight-chained or branched and includes those preferably having 1 to 6 carbon atoms. Examples of these alkyl groups are a methyl group, an ethyl group, an n-propyl group, an isopropyl group, an n-butyl group, an isobutyl group, a tert-butyl group, a sec-butyl group, an n-pentyl group, an isopentyl group, a neopentyl group, a tert-pentyl group, a 3,3-dimethylbutyl group, a 1,1-dimethylbutyl group, a 1-methylpentyl group, an n-hexyl group, an iso-hexyl group, etc.

The alkyloxycarbonyl group shown by $R^7$ and $R^8$ may be straight-chained, branched or cyclic and may contain a double bond and includes those having 2 to 19 carbon atoms. Examples the alkyloxycarbonyl group are a methyloxycarbonyl group, an ethyloxycarbonyl group, a propyloxycarbonyl group, butyloxycarbonyl group, a pentyloxycarbonyl group, a hexyloxycarbonyl group, a heptyloxycarbonyl group, an octyloxycarbonyl group, a dodecyloxycarbonyl group, an octadecyloxycarbonyl group, a cyclohexyloxycarbonyl group, an ethenyloxycarbonyl group, a propenyloxycarbonyl group, a butenyloxycarbonyl group, a tert-butyloxycarbonyl group, a 2-ethyl-hexyloxycarbonyl group, etc.

The hydrophilic group shown by $R^9$ includes a hydroxy group, a carboxyl group, a carbamoyl group, an amino group, a hydroxyalkyl group having 1 to 18 carbon atoms such as a hydroxymethyl group, a hydroxyethyl group, a hydroxypropyl group, a hydroxybutyl group, a hydroxypentyl group, a hydroxyhexyl group, a hydroxyheptyl group, a hydroxyoctyl group, a hydroxydodecyl group and a hydroxyoctadecyl group.

The spacer shown by Z includes a group of the formula:

[34]

wherein $R^{11}$ is a divalent hydrocarbon residue which may contain at least one oxygen atom; $R^{10}$ and $R^{12}$ are independently a lower alkylene group; and q, r, s and t are independently 0 or 1, provided that when q is 1, s is 1.

The divalent hydrocarbon residue in the divalent hydrocarbon residue which may contain at least one oxygen atom shown by $R^{11}$ in the formula [34] includes, for example, an alkylene group. The alkylene group may be straight-chained, branched or cyclic and includes those having 1 to 20 carbon atoms. Examples of such an alkylene group are a methylene group, an ethylene group, a propylene group, a butylene group, a 2-methylpropylene group, a pentylene group, a 2,2-dimethylpropylene group, 2-ethylpropylene group, a hexylene group, a heptylene group, an octylene group, a 2-ethylhexylene group, a nonylene group, a decylene group, a cyclopropylene group, a cyclopentylene group, a cyclohexylene group, an adamantane-di-yl group, a tricyclo[5,2,1,0$^{2,6}$]decane-di-yl group, a norbornane-di-yl group, a methylnorbornane-di-yl group, an isobornane-di-yl group, a decaline-di-yl group, etc., among which one having 1 to 10 carbon atoms is preferable.

The divalent hydrocarbon residue containing an oxygen atom includes one mentioned above which contains 1 or more, preferably 1 to 3 oxygen atoms in the chain of the hydrocarbon residue, which is specifically exemplified by a methoxyethylene group, an ethoxyethylene group, a bornyloxyethylethylene group, a norbornyloxyethylethylene group, a mentyloxyethylethylene group, a adamantyloxyethylethylene group, a methoxyethoxyethylethylene group, a ethoxyethoxyethylethylene group, a bornyloxyethoxyethylethylene group, a mentyloxyethoxyethylethylene group, —O—CH$_2$—, —O—CH$_2$CH$_2$—, —CH$_2$—O—CH$_2$, —CH$_2$CH$_2$—O—CH$_2$—, —CH$_2$CH$_2$—O—CH$_2$CH$_2$—, and —CH$_2$CH$_2$—O—CH$_2$CH$_2$—O—CH$_2$CH$_2$—.

The lower alkylene group shown by $R^{10}$ and $R^{12}$ may be straight-chained or branched and includes those having 1 to 6 carbon atoms. Examples of such a lower alkylene group are a methylene group, an ethylene group, a propylene group, a butylene group, a 2-methylpropylene group, a pentylene group, a 2,2-dimethylpropylene group, a 2-ethylpropylene group, a hexylene group, etc.

The monomer unit represented by the formula [33] include one derived from a monomer of the formula:

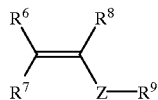

[35]

wherein $R^6$ to $R^9$ and Z are as defined above.

The specific examples of the monomers are those of the formulae:

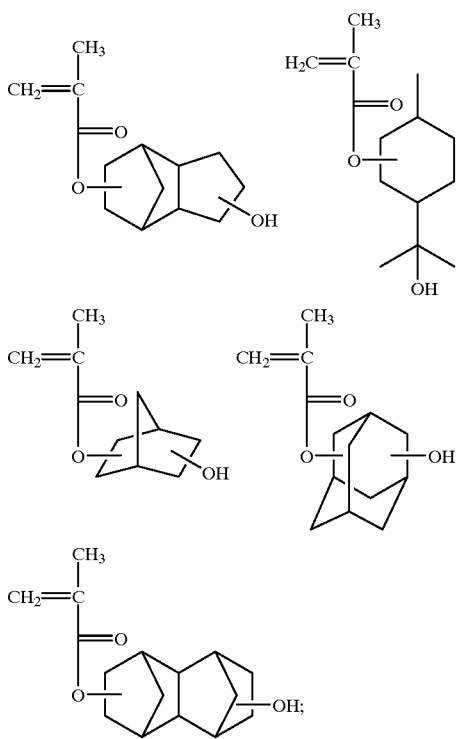

ethylenically unsaturated carboxylic acids having 3 to 20 carbon atoms such as acrylic acid, methacrylic acid, itaconic acid, maleic acid, fumaric acid, crotonic acid, citraconic acid, mesaconic acid, vinylacetic acid and allylacetic acid (these acids may form salts with an alkali metal such as sodium and potassium, or ammonium salts); ethylenically unsaturated carboxylic acid hydroxyalkyl esters having 4 to 20 carbon atoms such as 2-hydroxyethyl methacrylate, 3-hydroxypropyl methacrylate, 2-hydroxypropyl methacrylate, 2-hydroxyethyl acrylate, 3-hydroxypropyl acrylate and 2-hydroxypropyl acrylate; ethylenically unsaturated amide or imide compounds having 3 to 20 carbon atoms such as acrylamide, methacrylamide and maleimide; ethylenically unsaturated aldehydes having 3 to 20 carbon atoms such as acrolein and crotonaldehyde. The aliphatic alkali-soluble polymer includes homopolymers derived from one and the same monomer mentioned above and copolymers derived from two or more different kinds of monomers mentioned above.

The aliphatic alkali-soluble polymer used in the present invention may contain other monomer units as a structural component so far as the monomer units do not make the whole polymer alkali-insoluble. The other monomer mentioned just above includes alkenyl esters having 3 to 20 carbon atoms such as vinyl formate, vinyl acetate, vinyl propionate and isopropenyl acetate; halogen-containing ethylenically unsaturated compounds having 2 to 20 carbon atoms such as vinyl chloride, vinylidene chloride, vinylidene fluoride, tetrafluoroethylene and tetrachloroethylene; ethylenically unsaturated carboxylic acid esters having 4 to 20 carbon atoms such as methyl methacrylate, ethyl methacrylate, propyl methacrylate, butyl methacrylate, 2-ethylhexyl methacrylate, lauryl methacrylate, stearyl methacrylate, vinyl methacrylate, allyl methacrylate, adamantyl methacrylate, tricyclodecanyl methacrylate, mentyl methacrylate, norbornyl methacrylate, isobornyl methacrylate, methyl acrylate, ethyl acrylate, butyl acrylate, 2-ethylhexyl acrylate, lauryl acrylate, stearyl acrylate, vinyl acrylate, adamantyl acrylate, tricyclodecanyl acrylate, mentyl acrylate, norbornyl acrylate, isobornyl acrylate, dimethyl itaconate, diethyl itaconate, dimethyl maleate, diethyl maleate, dimethyl fumarate, diethyl fumarate, methyl crotonate, ethyl crotonate, vinyl crotonate, dimethyl citraconate, diethyl citraconate, dimethyl mesaconate, diethyl mesaconate and methyl 3-butenoate; cyano-containing ethylenically unsaturated compounds having 3 to 20 carbon atoms such as acrylonitrile, methacrylonitrile and allyl cyanide; ethylenically unsaturated amide compounds having 3 to 20 carbon atoms such as acrylamide, methacrylamide and maleimide; ethylenically unsaturated aldehydes having 3 to 20 carbon atoms such as acrolein and crotonaldehyde; ethylenically unsaturated aliphatic heterocyclic amines having 5 to 20 carbon atoms such as N-vinyl pyrrolidone and vinyl piperidine; ethylenically unsaturated alcohols having 3 to 20 carbon atoms such as allyl alcohol and crotyl alcohol; diene compounds having 4 to 20 carbon atoms such as butadiene and isoprene, etc. In the aliphatic alkali-soluble polymers, only one kind or two or more different kinds of monomer units derived from the above-mentioned monomers may be incorporated as a structural component.

As the above monomers, commercially available ones may be used or those produced according to a conventional method may be used. The specific examples of the aliphatic alkali-soluble polymer used in the present invention are those containing one or more segments represented by the following formulae:

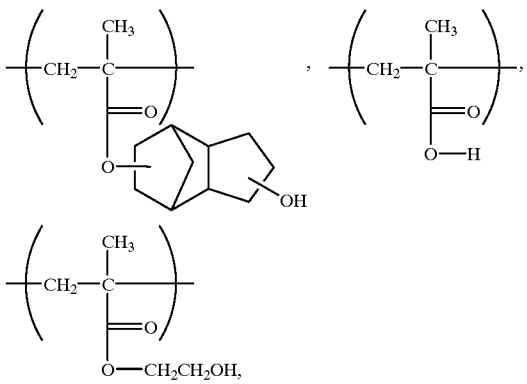

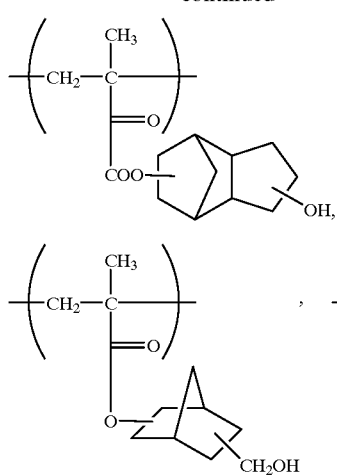
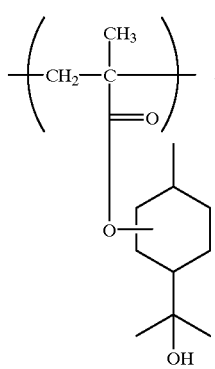
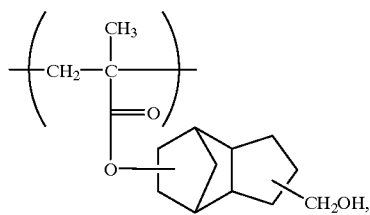
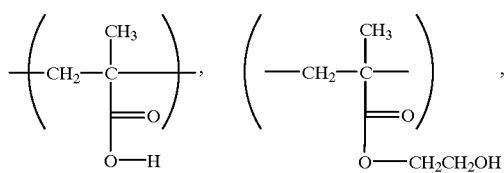
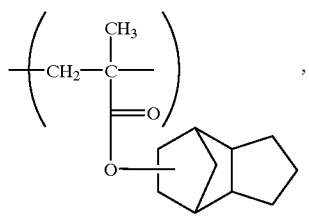
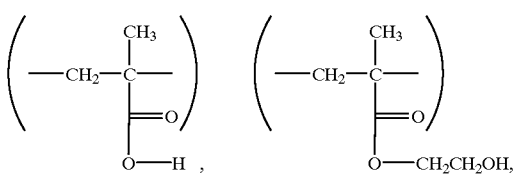

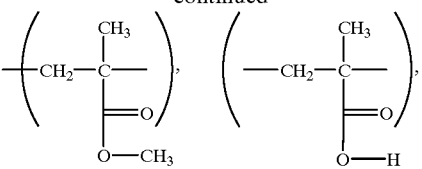
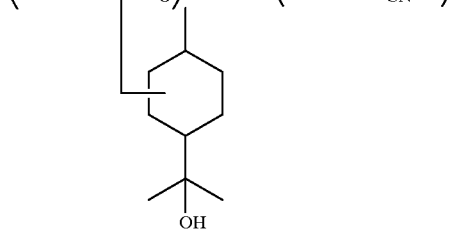
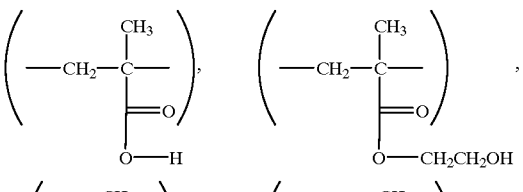
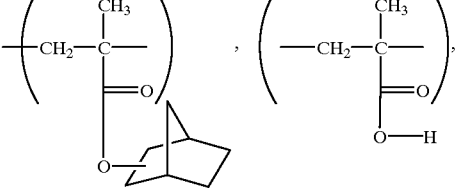
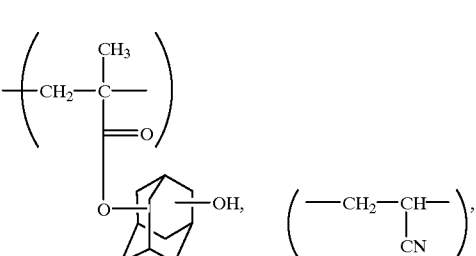
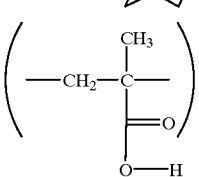

The photo-sensitive compound generating an acid upon exposure to light (hereinafter, abbreviated as "a photoacid generator") which is used in combination with the cross-linking agent of the present invention in the resist composition may be any of photo-sensitive compounds which generate an acid upon exposure to light and give no bad influence upon formation of a pattern. Among them, those which show high transmittance around a wavelength of 193 nm and maintain high transparency of a resist composition, or give enhanced transmittance around a wavelength of 193 nm upon exposure to light and maintain high transparency of a resist composition are particularly desirable.

Examples of such preferable photoacid generators include commercially available ones, that is, sulfonium salts such as trimethylsulfonium/trifluoromethane sulfonate, triphenylsulfonium/trifluoromethane sulfonate, cyclohexylmethyl(2-oxo-cyclohexyl)sulfonium/trifluoromethane sulfonate, cyclopentylmethyl(2-oxo-cyclohexyl)sulfonium/trifluoromethane sulfonate and 2-oxo-cyclohexylmethyl(2-norbornyl)sulfonium/trifluoromethane sulfonate; acid imides such as trifluoromethyl sulfonyloxy-7-oxabicyclo[2,2,1]hept-5-ene-2,3-dicarboxylimide, trifluoromethyl sulfonyloxy bicyclo[2,2,2]hept-5-ene-2,3-carboxylimide and trifluoromethyl sulfonyloxy succinimide; diazodisulfone compounds such as 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(isopropylsulfonyl)diazomethane, bis(tert-butylsulfonyl)diazomethane, tert-butylsulfonylmethyl sulfonyl diazomethane and cyclohexylsulfonyl ethylsulfonyl diazomethane.

The solvent used in the case of using the cross-linking agent of the present invention in the resist composition may be any of those capable of dissolving the cross-linking agent of the present invention, the aliphatic alkali-soluble polymer and the photoacid generator. Particularly, solvents improving good film-forming ability and having no absorbance around a wavelength of 190 to 400 nm are preferably used. Specific examples of the solvents are methyl Cellosolve acetate, ethyl Cellosolve acetate, propylene glycol monomethyl ether acetate, propylene glycol monoethyl ether acetate, methyl lactate, ethyl lactate, 2-ethoxyethyl acetate, methyl pyruvate, ethyl pyruvate, methyl 3-methoxypropionate, ethyl 3-methoxypropionate, N,N-dimethylformamide, N,N-dimethylacetamide, N-methyl-2-pyrrolidone, cyclohexanone, methyl ethyl ketone, 2-heptanone, 1,4-dioxane, diethylene glycol monomethyl ether, diethylene glycol dimethyl ether, ethylene glycol monoisopropyl ether, etc.

The resist composition of the present invention comprises mainly the above-mentioned four components (i.e. (b) the cross-linking agent of the present invention, (c) the photoacid generator, (a) the aliphatic alkali-soluble polymer and (d) the solvent), and, if necessary, may further contain one or more UV-light absorbers such as 9-diazofluorene and its derivatives, 1-diazo-2-tetralone, 2-diazo-1-tetralone, 9-diazo-10-phenanthrone, 9-(2-methoxyethoxy)methyl anthracene, 9-(2-ethoxyethoxy) methyl anthracene, 9-(4-methoxybutoxy)methyl anthracene, 9-anthracene methyl acetate and benzophenone.

The resist composition may still further contain one or more sensitivity regulators [such as polyvinyl pyridine, polyvinyl pyridine/methyl methacrylate), pyridine, piperidine, triethylamine, tri-n-propylamine, tri-n-butylamine, trioctylamine, tri-benzylamine, dicyclohexylamine, dicyclohexylmethylamine, tetramethylammonium hydroxide, tetraethylammonium hydroxide, tetra-n-butylammonium hydroxide and N-methyl-2-pyrrolidone], plasticizers [such as diethyl phthalate, dibutyl phthalate and dipropyl phthalate]; organic acids [such as salicylic acid, lactic acid, 2-hydroxynaphthalene-3-carboxylic acid, 2-nitrobenzoic acid, phthalic acid, succinic acid and malonic acid] and surfactants [such as commercially available nonionic surfactants, cationic surfactants, anionic surfactants and fluorine type surfactants {such as one being put in the market under the trade names of Fluorad (a trade name, mfd. by SUMITOMO 3M Co., ltd.), EFTOP (a trade name, mfd. by TOHKEMPRODUCTS Corp.), SURFLON (a trade name, mfd. by Asahi Glass Co., Ltd.), Ftergent (a trade name, mfd. by Neos, Co., Ltd.), MEGAFAC (a trade name, mfd. by Dainippon Ink and Chemicals, Inc.) and UNIDYNE (a trade name, mfd. by DAIKIN INDUSTRIES, LTD.)}], which have conventionally been used in this technical field.

Formation of a pattern with the use of the resist composition of the present invention can be conducted, for instance, as follows.

The resist composition containing the cross-linking agent of the present invention is applied to a substrate for a semiconductor device such as silicon wafer to form a layer having a thickness of 0.3 to 2.0 $\mu$m (when the layer is used as the top coat layer in three layers, the thickness is 0.1 to 0.5 $\mu$m), and the resultant is prebaked at 70 to 130° C. in an oven for 10 to 30 minutes or at 60 at 150° C., preferably 60 to 110° C. on a hot plate for 180 seconds.

Then, a mask for obtaining the desired pattern is placed over the thus obtained resist film and a deep UV-light having a wavelength of 220 nm or less is irradiated thereon at a dose of 1 to 100 mJ/cm$^2$, followed by baking at 60 to 150° C., preferably 80 to 110° C. on a hot plate for 60 to 180 sec. Finally, development using 0.1 to 5% aqueous tetramethylammonium hydroxide (TMAH) solution or other alkaline developing solution is conducted on the resultant for 0.5 to 3 minutes by a dip method, a puddle method, a spray method or other conventional method, whereby the object negative pattern can be formed on the substrate.

The mixing ratio of the cross-linking agent of the present invention, the photoacid generator, the aliphatic alkali-soluble polymer is usually 1 to 30 parts by weight, preferably 1 to 20 parts by weight of the photoacid generator and 1 to 40 parts by weight, preferably 1 to 20 parts by weight of the cross-linking agent based on 100 parts by weight of the polymer. The amount of the solvent in the resist composition of the present invention is not specifically limited so long as application of the negative working resist composition obtained by dissolving the aliphatic alkali-soluble polymer and the photoacid generator to a substrate is not hindered. The amount of the solvent is generally within the range of 1 to 20 parts by weight, preferably 1.5 to 10 parts by weight per part by weight of the polymer.

The developing solution used in various processes for forming a pattern mentioned above is selected from an aqueous alkaline solution having such a suitable concentration as being capable of causing a large difference in solubility of the resist material between the exposed part and the non-exposed part in accordance with a solubility of a resist material used. The aqueous alkaline solution includes an aqueous solution containing an organic amine such as tetramethylammonium hydroxide (TMAH), tetraethylammonium hydroxide, tetrapropylammonium hydroxide, tetrabutylammonium hydroxide, choline, triethanolamine, morpholine, and 1-methylmorpholine, and an aqueous solution containing an inorganic alkaline compound such as sodium hydroxide and potassium hydroxide.

The substrate for a semiconductor device includes a silicon wafer, polysilicone, a TiN substrate, a BPSG substrate, an anti-reflective substrate, etc. The substrate is preferably treated previously with an agent for treating substrate such as hexamethyl disilazane (HMDS).

When an aliphatic alkali-soluble polymer containing a monomer unit represented by the formula [33] as a structural component is used as the polymer in the resist composition of the present invention, the following remarkable effect can be attained. Namely, the composition shows higher transmittance against deep UV-light as compared with polymers which have so far been used for the same purpose, and further a cross-linking reaction takes place in the presence of the cross-linking agent having high transmittance against deep UV-light, which is represented by the formula [1], [2] and/or [3] and the photoacid generator so that a good negative resist pattern is obtained after the alkaline development, resulting in making it possible to manufacture semiconductor devices having much highly integrated semiconductor integrated circuits.

It is recognized that an acid is generated by irradiation with any of a deep UV-light, KrF excimer laser beams, electron beams and soft X-ray to cause chemical amplification in the resist composition of the present invention by suitably selecting the photoacid generator. Therefore, the resist composition of the present invention can be said as one which can form a pattern using chemical amplification even by irradiation with a deep UV-light, KrF excimer laser beams, electron beams or soft X-ray at a low irradiation dose.

In the following, mechanism is explained in a case of the resist composition containing the cross-linking agent of the present invention. For instance, in the part exposed to a deep UV-light having a wavelength of 220 nm or less such as ArF excimer laser beams ($\lambda$=193 nm), an acid is generated by a photo reaction shown by the following [equation 1], [equation 2], [equation 3], etc.

[Equation 1]

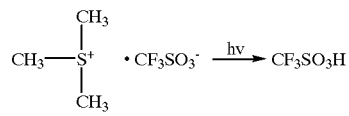

[Equation 2]

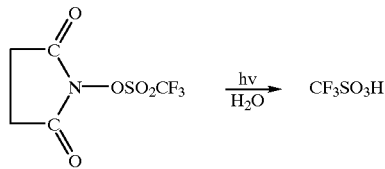

[Equation 3]

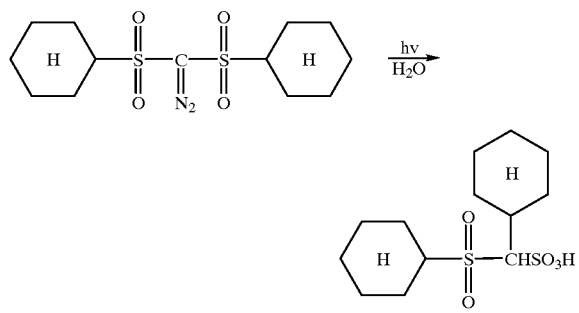

After the exposure process, the resultant is heated, whereby a cross-linking reaction is occurred between the hydrophilic group of the polymer of the present invention and the cross-linking agent containing 2 or more epoxy groups in the presence of an acid as illustrated in the [equation 4] so as to make the polymer alkali-insoluble.

[Equation 4]

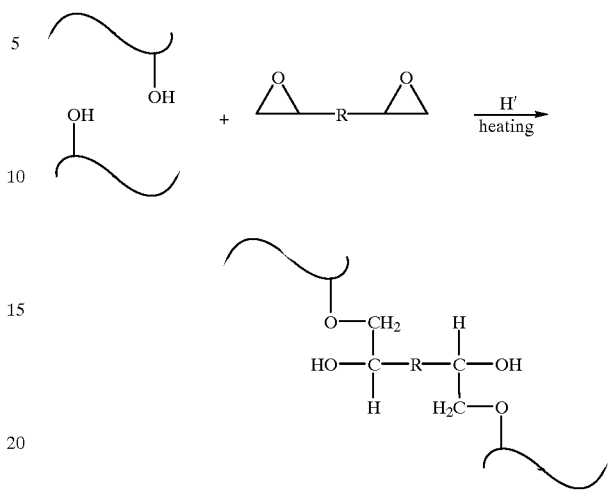

On the other hand, in the part not exposed to light, no acid is generated and thus no chemical reaction takes place even by heating, and as a result, the polymer remains alkali-soluble. In this way, when a pattern formation is conducted with the use of the resist composition of the present invention, there is caused a difference in solubility in an alkaline developing solution between the part exposed to light and the part not exposed to light, and thus a well-contrasted negative pattern is formed.

The present invention is further explained in details referring to Examples and Reference Examples, but it is not limited thereto by any means.

The photoacid generators used in the Examples can be synthesized by the methods disclosed in JP-A 7-25846, T. M. Chapman et al, Synthesis, 1971, p 591; and T. M. Chapman et al, J. Org. Chem. vol 38, p 3908 (1973), these references being incorporated herein by reference.

EXAMPLE 1

Synthesis of 1,3,5-tris(3,4-epoxy cyclohexane carbonyloxy)cyclohexane

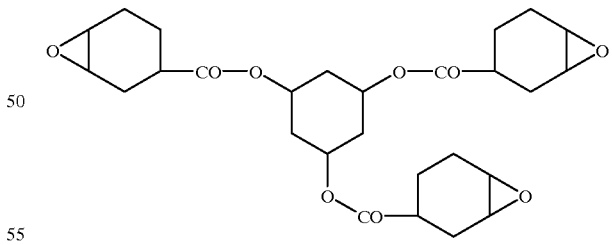

(1) (Synthesis of 1,3,5-tris(3-cyclohexene carbonyloxy) cyclohexane

To 1.32 g (10 mmol) of cyclohexane-1,3,5-triol (a mixture of cis- and trans-isomers) dissolved in 20 ml of pyridine was added dropwise 6.51 g (45 mmol) of 3-cyclohexene carbonyl chloride within 30 minutes at 5° C. or lower, followed by stirring at 0 to 5° C. for 4 hours to allow the reaction to proceed. After the reaction, the reaction solution was poured into a mixture of 50 ml of 10% hydrochloric acid and 50 ml of ice water, and the resultant was extracted with 30 ml of chloroform three times. The combined organic layers were washed twice with 30 ml of saturated sodium bicarbonate solution and then with 30 ml of saturated sodium chloride solution and dried over anhydrous magnesium sulfate. The solvent was removed under reduced pressure to give 4.6 g of the desired 1,3,5-tris(3-cyclohexene carbonyloxy) cyclohexane as a pale yellow oil.

$^1$H-NMR δ ppm (CDCl$_3$, 270 MHz): 1.37–2.71 (m, 27H), 4.79–5.33 (m, 3 H), 5.68 (s, 6H).

(2) Synthesis of 1,3,5-tris(3,4-epoxy cyclohexane carbonyloxy)cyclohexane

To a mixture of 2.17 grams (4.75 mmol) of 1,3,5-tris(3-cyclohexene carbonyloxy)cyclohexane obtained in (1) and 20 ml of methylene chloride, was added 2.95 g (17.1 mmol) of metachloro perbenzoic acid, followed by refluxing for 30 minutes to allow the reaction to proceed. After the reaction, 20 ml of methylene chloride was added to the reaction solution and the resultant was washed twice with 30 ml of saturated sodium bicarbonate solution and then with 30 ml of saturated sodium chloride solution and dried over anhydrous magnesium sulfate. The solvent was removed under reduced pressure and the resulting crude product was purified by column chromatography [packing: Wakogel C-200 (manufactured and sold by Wako Pure Chemical Industries, Ltd.); eluent: n-hexane/ethyl acetate=3/2] to give 2.04 g (yield: 85.0%) of the desired 1,3,5-tris(3,4-epoxy cyclohexane carbonyloxy)cyclohexane as a viscous pale yellow oil.

$^1$H—NMR δ ppm (CDCl$_3$, 270 MHz): 1.34—2.70 (m, 27H), 3.16, 3.23 (each s, total 6H), 4.78, 5.08 (each brs. total 3H).

EXAMPLE 2

Synthesis of 1,2,3-tris(3,4-epoxy cyclohexane carbonyloxy)propane (1) Synthesis of 1,2,3-tris(3-cyclohexene carbonyloxy) propane Glycerine in an amount of 2.76 grams (30 mmol), 9.56 g (94.5 mmol) of triethylamine and 15 ml of methylene chloride were mixed and cooled to 5° C. or lower. To the resulting mixture was added dropwise 13.01 g (90 mmol) of 3-cyclohexene carbonyl chloride within 30 minutes, followed by stirring for 6 hours at 0 to 5° C. to allow the reaction to proceed. After the reaction, 30 ml of methylene chloride was added to the reaction solution and the resultant was washed with 30 ml of 5% hydrochloric acid, 30 ml of water and 30 ml of saturated sodium chloride solution in this order and dried over anhydrous magnesium sulfate. The solvent was removed under reduced pressure and the resulting crude product was purified by column chromatography [packing: Wakogel C-200 (manufactured and sold by Wako Pure Chemical Industries, Ltd.); eluent: n-hexane/ethyl acetate=3/2] to give 10.0 g (yield: 80.0%) of the object 1,2,3-tris(3 cyclohexene carbonyloxy)propane as a pale yellow oil.

$^1$H-NMR δ ppm (CDCl$_3$, 270 MHz): 1.63–1.78 (m, 3 H), 1.97–2.17 (m, 9H), 2.25–2.29 (m, 6H), 2.57–2.68 (m, 3 H), 4.08–4.25 (m, 5H), 5.68 (s, 6H).

(2) Synthesis of 1,2,3-tris(3,4-epoxy cyclohexane carbonyloxy)propane

To a mixture of 1.68 grams (4.03 mmol) of 1,2,3-tris(3-cyclohexene carbonyloxy)propane obtained in (1) and 10 ml of methylene chloride, was added 2.50 g (14.5 mmol) of metachloro perbenzoic acid, followed by refluxing for 1 hour to allow the reaction to proceed. After the reaction, 10 ml of methylene chloride was added to the reaction solution and the resultant was washed twice with 15 ml of saturated sodium bicarbonate solution and then with 15 ml of saturated sodium chloride solution and dried over anhydrous magnesium sulfate. The solvent was removed under reduced pressure and the resulting crude product was purified by column chromatography [packing: Wakogel C-200 (manufactured and sold by Wako Pure Chemical Industries, Ltd.); eluent: n-hexane/ethyl acetate=3/2] to give 1.54 g (yield: 82.0%) of the object 1,2,3-tris(3,4-epoxy cyclohexane carbonyloxy)propane as a viscous pale yellow oil.

$^1$H-NMR δ ppm (CDCl$_3$, 270 MHz): 1.39–2.62 (m, 27H), 3.18, 3.25 (each s, total 6H), 4.04–4.32 (m, 5H).

Reference Example 1

Synthesis of a Polymer Containing the Following Segments

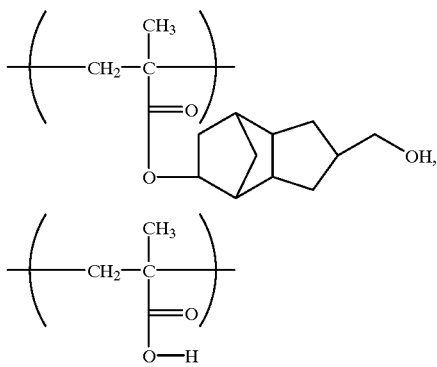

A mixture of 21.1 grams (80 mmol) of 8-(4-hydroxymethyl-tricyclo[5,2,0$^{2.5}$]decanyl)methacrylate, 1.72 g (20 mmol) of methacrylic acid, and 60 ml of anhydrous tetrahydrofuran (hereinafter, abbreviated as THF) was prepared, followed by heating at 65° C. and then 0.71 g (4.3 mmol) of azobisisobutyronitrile (hereinafter, abbreviated as "AIBN") was added thereto. Subsequently a polymerization reaction was conducted at 65° C. for 5 hours under a nitrogen gas stream. After the reaction, the reaction solution was poured into 700 ml of n-hexane to precipitate a polymer. The polymer was collected by filtration and dried to give 18.9 g (Yield: 83%) of the desired product. The structural ratio of 8-(4-hydroxymethyl-tricyclo[5,2,0$^{2.6}$]decanyl) methacrylate unit/methacrylic acid unit of the resulting polymer was found to be about 0.82:0.18 by $^1$H-NMR measurement. A weight-average molecular weight (Mw) and a dispersity were 13,700 and 1.75, respectively, by GPC (gel permeation chromatography, solvent: THF) measurement using polystyrene as a standard.

Reference Example 2

Synthesis of a Polymer Containing the Following Segments

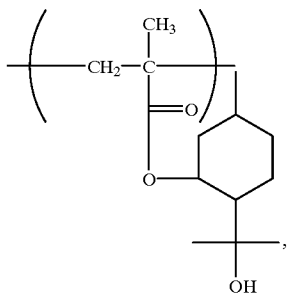

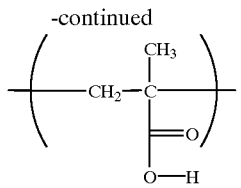

A mixture of 20.3 grams (85 mmol) of (8-hydroxymethyl) methacrylate, 1.29 g (15 mmol) of methacrylic acid, and 60 ml of dried tetrahydrofuran was prepared, followed by heating at 65° C. and 0.71 g (4.3 mmol) of AIBN was added thereto. Then, polymerization reaction was carried out at 65° C. for 5 hours under a nitrogen gas stream. After the reaction, the reaction solution was poured into 700 ml of n-hexane to precipitate a polymer. The polymer was collected by filtration and dried to give 18.6 g (Yield: 86%) of the desired product. The structural ratio of (8-hydroxymentyl) methacrylate unit/methacrylic acid unit of the resulting polymer was found to be about 0.86:0.14 by $^1$H-NMR measurement. A weight-average molecular weight (Mw) and a dispersity were found to be 14,500 and 1.87, respectively, by GPC (gel permeation chromatography, solvent: THF) measurement using polystyrene as a standard.

EXAMPLE 3

A resist composition comprising the following components was prepared:

| | | |
|---|---|---|
| (a) | the polymer obtained in Reference Example 1 | 4.0 g |
| (b) | a photoacid generator (triphenylsulfonium trifluoromethane sulfonate) | 0.2 g |
| (c) | a cross-linking agent of the following formula: (manufactured and sold by CIBA-GEIGY under a trade name CY-179) | 0.4 g |
| | 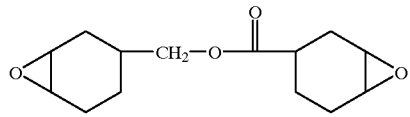 | |
| (d) | propylene glycol monomethyl ether acetate | 16.0 g |

The above resist composition was filtered by 0.1 μm Tefron filter, and the resulting filtrate was spin-coated on a silicon wafer, followed by baking on a hot plate at 90° C. for 60 seconds to give a resist film of 0.5 μm thick. Then, the wafer on which a film was formed is placed in a close-contact type exposure machine wherein the air was sufficiently substituted with nitrogen gas, and irradiated with ArF excimer laser beams (λ=193 nm, NA 0.55) at a dose of 10 mJ/cm² through a mask on which a pattern was formed. After the irradiation, the resultant was heated on a hot plate at 120° C. for 60 seconds, developed with a developing solution [2.38% TMAH aqueous solution, temperature 23 ° C.] by the puddle method for 60 seconds, and then subjected to rinsing with pure water for 60 seconds to give a negative type pattern with line and space of 0.18 μm (irradiation dose: about 10 mJ/cm²).

EXAMPLE 4

A resist composition comprising the following components was prepared:

| | | |
|---|---|---|
| (a) | the polymer obtained in Reference Example 2 | 4.0 g |
| (b) | a photoacid generator (triphenylsulfonium trifluoro methane sulfonate) | 0.2 g |
| (c) | the cross-linking agent obtained in Example 1 | 0.8 g |
| (d) | propylene glycol monomethyl ether acetate | 16.0 g |

The above resist composition was subjected to formation of a resist film, irradiation, heat treatment and development in the same manner as described in Example 3 to given a negative type pattern with line and space having the maximum resolution degree of 0.15 μm (irradiation dose: about 15 mJ/cm²).

As mentioned above, the present invention provides a novel resist composition used in the production of semiconductor devices, etc., a process for forming a pattern using the resist composition and a novel cross-linking agent for an ArF negative resist material. The resist composition of the present invention contains a specific cross-linking agent containing 2 or more epoxy groups per molecule and an aliphatic alkali-soluble polymer, and thus the composition makes it possible to form highly qualified fine negative type pattern using a deep UV-light of short wavelength such as ArF excimer laser beams and also can attain good dry etching resistance. For this reason, the resist composition can advantageously be utilized as a material for ArF excimer laser beams negative type resist. Therefore, the present invention has high value for formation of fine patterns in semiconductor industries, etc.

What is claimed is:

1. A negative working resist composition comprising (a) an aliphatic alkali-soluble polymer,
   (b) a compound represented by the formula:

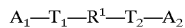

$$A_1-T_1-R^1-T_2-A_2 \qquad [1]$$

wherein R¹ is a divalent aliphatic hydrocarbon residue which may contain at least one of —O—, —CO—, —COO— and —OCO—; A₁ and A₂ are independently an alkyl group containing one or more oxirane rings; and T₁ and T₂ are independently, —O—, —COO— or —OCO—,

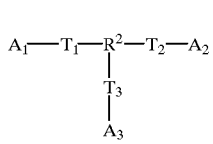

[2]

wherein R² is a trivalent aliphatic hydrocarbon residue which may contain at least one of —O—, —CO—, —COO— and —OCO—; A₁ to A₃ are independently an alkyl group containing one or more oxirane rings; and T₁ to T₃ are independently, —O—, —COO— or —OCO—, or

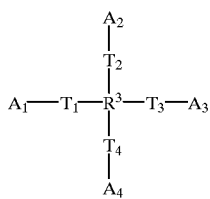

wherein $R^3$ is a tetravalent aliphatic hydrocarbon residue which may contain at least one of —O—, —CO—, —COO— and —OCO—; $A_1$ to $A_4$ are independently an alkyl group containing one or more oxirane rings; and $T_1$ to $T_4$ are independently, —O—, —COO— or —OCO—, (c) a photo-sensitive compound which generates an acid upon exposure to light, and (d) a solvent capable of dissolving the above components (a) to (c).

2. A resist composition according to claim 1, wherein $A_1$ and $A_2$ in the formula [1] are independently a cycloalkyl group containing one or more oxirane rings.

3. A resist composition according to claim 1, wherein $A_1$ to $A_3$ in the formula [2] are independently a cycloalkyl group containing one or more oxirane rings.

4. A resist composition according to claim 1, wherein $A_1$ to $A_4$ in the formula [3] are independently a cycloalkyl group containing one or more oxirane rings.

5. A process for forming a pattern, which comprises a step of applying a resist composition of claim 1 to a substrate, a step of subjecting the resulting substrate to heat treatment and exposure to light having a wavelength of 220 nm or less through a mask, and a step of developing the thus treated substrate using a developing solution, if necessary, after baking treatment.

6. A cross-linking agent for an ArF negative working resist material, comprising a compound represented by the formula:

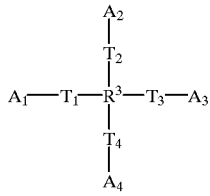

wherein; $R^3$ is a tetravalent aliphatic hydrocarbon residue which may contain at least one of —O—, —CO—, —COO— and —OCO—; $A_1$, $A_2$, $A_3$ and $A_4$ are independently an alkyl group containing one or more oxirane rings; and $T_1$, $T_2$, $T_3$ and $T_4$ are independently —COO— or —OCO—, provided that $R^3$ is not $C(CH_2)_4$ group.

7. A cross-linking agent according to claim 6, wherein $A_1$ to $A_4$ in the formula [3] are independently a cycloalkyl group containing one or more oxirane rings.

8. A compound represented by the formula:

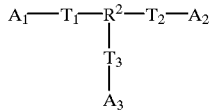

wherein $R^2$ is a trivalent aliphatic hydrocarbon residue which may contain at least one of —O—, —CO—, —COO— and —OCO—; $A_1$ to $A_3$ are independently an alkyl group containing one or more oxirane rings; and $T_1$ to $T_3$ are independently, —O—, —COO— or —OCO—, provided that when $R^2$ is

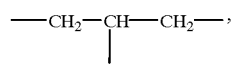

each of $T_1$ to $T_3$ is not —O— or —OCO— and each of $A_1$ to $A_3$ is not a glycidyl group, a 3,4-epoxycyclohexyl group or a 2,3-epoxycyclohexyl group.

9. A compound according to claim 8, wherein $A_1$ to $A_3$ in the formula [2] are independently a cycloalkyl group containing one or more oxirane rings.

10. A compound according to claim 8, which is 1,3,5-tris (3,4-epoxycyclohexanecarbonyloxy)cyclohexane.

11. A compound according to claim 8, wherein $R^2$ is a cyclic trivalent aliphatic hydrocarbon residue having 3 to 7 carbon atoms; $A_1$ to $A_3$ are independently a 2,3-epoxy cyclopentyl group, a 3,4-epoxy cyclopentyl group, a 2,3-epoxy cyclohexyl group, a 3,4-epoxy cyclohexyl group a 2,3-epoxy cycloheptyl group, a 3,4-epoxy cycloheptyl group or a 4,5-epoxy dicycloheptyl group; and $T_1$ to $T_3$ are independently —O—, —COO— or —OCO—.

12. A compound according to claim 8, wherein $R^2$ is a trivalent aliphatic hydrocarbon residue which may contain at least one of —O—, —CO—, —OCO—; $A_1$ to $A_3$ are independently a 2,3-epoxy cyclopentyl group, a 3,4-epoxy cyclopentyl group, a 2,3-epoxy cyclohexyl group, a 3,4-epoxy cyclohexyl group, a 2,3-epoxy cycloheptyl group, a 3,4-epoxy cycloheptyl group or a 4,5-epoxy dicycloheptyl group; and $T_1$ to $T_3$ are independently —O—, —COO— or —OCO—.

13. A compound according to claim 12, wherein $R^2$ is a group of the formula:

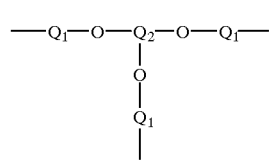

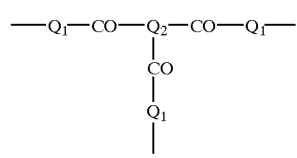

-continued

[13]
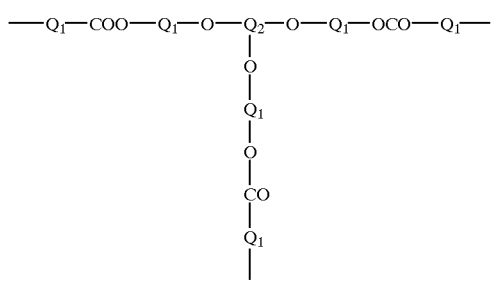

[14]
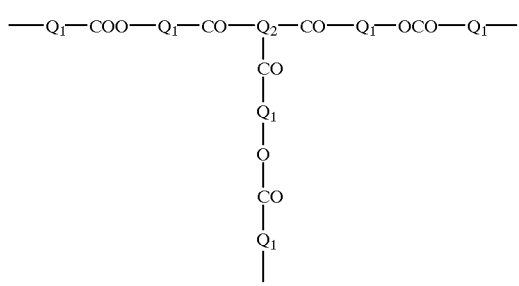

[15]
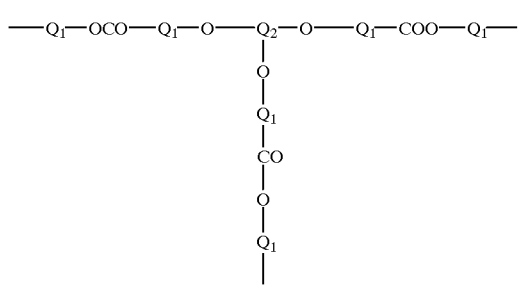

[16]
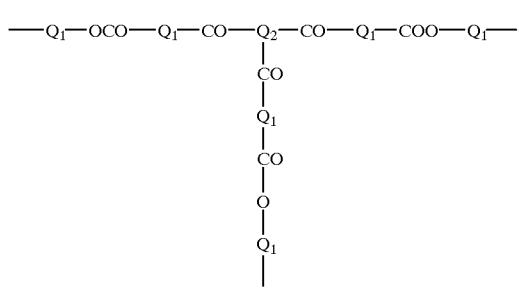

[17]
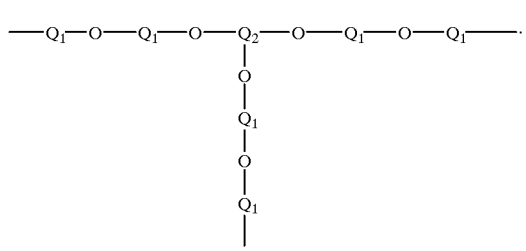

wherein $Q_1$ is a divalent alphatic hydrocarbon residue; and $Q_2$ is a cyclic trivalent aliphatic hydrocarbon residue having 3 to 7 carbon atoms.

14. A compound represented by the formula:

[2]
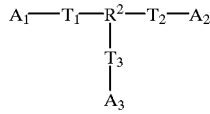

wherein $R^2$ is a trivalent aliphatic hydrocarbon residue which may contain at least one of —O—, —CO—, —COO— and —OCO—; $A_1$, $A_2$, and $A_3$ are independently an alkyl group containing one or more oxirane rings; and $T_1$, $T_2$, and $T_3$, are independently —O— or —COO—, provided that when $R^2$ is

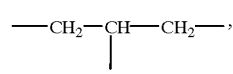

each of $T_1$, $T_2$ and $T_3$ is not —O— and each of $A_1$, $A_2$, and $A_3$ is not group.

15. A compound represented by the formula:

[2]
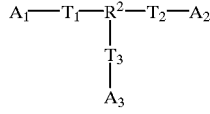

wherein $R^2$ is cyclic trivalent aliphatic hydrocarbon residue which may contain at least one of —O—, —CO—, —COO— and —OCO—; $A_1$, $A_2$, and $A_3$ are independently an alkyl group containing one or more oxirane rings; and $T_1$, $T_2$, and $T_3$, are independently —O—, —COO— or —OCO—.

16. A cross-linking agent for an ArF negative working resist material, comprising a compound represented by the formula:

[2]
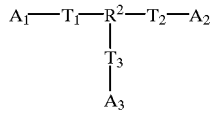

wherein $R^2$ is a trivalent aliphatic hydrocarbon residue which may contain at least one of O—, —CO—, —COO— and —OCO—; $A_1$, $A_2$, and $A_3$ are independently an alkyl group containing one or more oxirane rings; and $T_1$, $T_2$, and $T_3$, are independently —O—, —COO— or —OCO— provided that when $R^2$ is

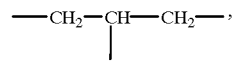

each of $T_1$, $T_2$ and $T_3$ is not —OCO— or —O—.

17. A cross-linking agent for an ArF negative working resist material, comprising a compound represented by the formula:

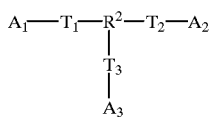

[2]

wherein $R^2$ is a trivalent aliphatic hydrocarbon residue which may contain at least one of —CO—, and —COO—; $A_1$, $A_2$, and $A_3$ are independently an alkyl group containing one or more oxirane rings; and $T_1$, $T_2$, and $T_3$ are —COO—.

18. A cross-linking agent for an ArF negative working resist material, comprising a compound represented by the formula:

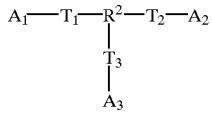

[2]

wherein $R^2$ is a cyclic trivalent aliphatic hydrocarbon residue which may contain at least one of —O—, —CO—, —COO— and —OCO—; $A_1$, $A_2$, and $A_3$ are independently an alkyl group containing one or more oxirane rings; and $T_1$, $T_2$, and $T_3$, are independently —O—, —COO— or —OCO—.

19. A cross-linking agent for an ArF negative working resist material, comprising a compound represented by thee formula:

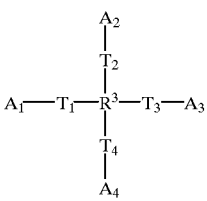

[3]

wherein $R^3$ is a tetravalent aliphatic hydrocarbon residue which may contain at least one of —O—, —CO—, and —COO—; $A_1$, $A_2$, $A_3$ and $A_4$ are independently an alkyl group containing one or more oxirane rings; and $T_1$, $T_2$, $T_3$ and $T_4$ are independently —COO—.

20. A cross-linking agent for an ArF negative working resist material, comprising a compound represented by the formula:

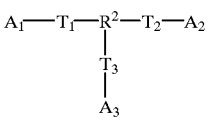

[2]

wherein $R^2$ is a trivalent aliphatic hydrocarbon residue which may contain at least one of —O—, —CO—, —COO— and —OCO—; $A_1$, $A_2$ and $A_3$ are independently a cycloalkyl group containing one or more oxirane rings; and $T_1$, $T_2$, and $T_3$, are independently —O—, —COO— or —OCO—, provided that
when $R^2$ is

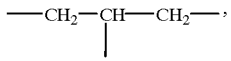

each of $T_1$, $T_2$ and $T_3$ is not —OCO—.

* * * * *